(12) United States Patent
Yang et al.

(10) Patent No.: US 7,964,966 B2
(45) Date of Patent: Jun. 21, 2011

(54) VIA GOUGED INTERCONNECT STRUCTURE AND METHOD OF FABRICATING SAME

(75) Inventors: Chih-Chao Yang, Albany, NY (US); Daniel C. Edelstein, Yorktown Heights, NY (US); Theodorus E. Standaert, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 67 days.

(21) Appl. No.: 12/494,564

(22) Filed: Jun. 30, 2009

(65) Prior Publication Data

US 2010/0327446 A1  Dec. 30, 2010

(51) Int. Cl.
*H01L 23/48* (2006.01)
*H01L 21/4763* (2006.01)
*H01L 21/44* (2006.01)

(52) U.S. Cl. . 257/751; 257/758; 257/774; 257/E21.579; 257/E21.584; 257/E21.585; 438/627; 438/629; 438/643; 438/653; 438/687

(58) Field of Classification Search .................. 438/627, 438/629, 643, 653, 687
See application file for complete search history.

(56) References Cited

U.S. PATENT DOCUMENTS

| 7,528,066 | B2 | 5/2009 | Yang et al. | |
| 7,846,834 | B2 * | 12/2010 | Yang et al. | 438/637 |
| 2008/0067680 | A1 * | 3/2008 | Sakai et al. | 257/751 |
| 2008/0128907 | A1 * | 6/2008 | Yang et al. | 257/751 |
| 2009/0218691 | A1 * | 9/2009 | Yang et al. | 257/751 |

* cited by examiner

*Primary Examiner* — Hsien-ming Lee
(74) *Attorney, Agent, or Firm* — Scully, Scott, Murphy & Presser, P.C.; Joseph Petrokaitis, Esq.

(57) ABSTRACT

An interconnect structure including a gouging feature at the bottom of a via opening and a method of forming the same are provided. The method of the present invention does not disrupt the coverage of the deposited trench diffusion barrier in a line opening that is located atop the via opening, and/or does not introduce damages caused by creating a gouging feature at the bottom of the via opening by sputtering into the interconnect dielectric material that includes the via and line openings. Such an interconnect structure is achieved by providing a gouging feature in the bottom of the via opening by first forming the line opening within the interconnect dielectric, followed by forming the via opening and then the gouging feature.

18 Claims, 7 Drawing Sheets

US 7,964,966 B2

VIA GOUGED INTERCONNECT STRUCTURE AND METHOD OF FABRICATING SAME

BACKGROUND

The present invention relates to a semiconductor structure and a method of fabricating the same. More particularly, the present invention relates to a semiconductor interconnect structure including a gouging feature located at the bottom of a via opening and a method of fabricating the same.

Generally, semiconductor devices include a plurality of circuits which form an integrated circuit fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. Within a typical interconnect structure, metal vias run perpendicular to the semiconductor substrate and metal lines run parallel to the semiconductor substrate.

As millions and millions of devices and circuits are squeezed on a semiconductor chip, the wiring density and the number of metal levels are both increased generation after generation. In order to provide low RC for high signal speed, low k dielectric materials having a dielectric constant of less than silicon dioxide as well as copper-containing lines are becoming a necessity. The quality of thin metal wirings and studs formed by a conventional damascene process is extremely important to ensure yield and reliability. The major problem encountered in this area today is poor mechanical integrity of deep submicron metal studs embedded in low k dielectric materials, which can cause unsatisfied thermal cycling and stress migration resistance in interconnect structures. This problem becomes more severe when either new metallization approaches or porous low k dielectric materials are used.

To solve this weak mechanical strength issue while employing copper damascene and low k dielectric materials in an interconnect structure, a so called "via punch-through" technique has been adopted by the semiconductor industry. The via punch-through provides a via-gouging feature (or anchoring area) within the interconnect structure. Such a via-gouging feature is reported to achieve a reasonable contact resistance as well as an increased mechanical strength of the contact stud.

However, the argon sputtering technique that is used to create via gouging in the prior art not only removes the deposited liner material, e.g., TaN, from the trench (i.e., line opening) bottom, but also damages the low k dielectric material. Because of the requirement of creating the gouging feature, the final interconnect structure not only has poor liner coverage at the trench bottom, but severe damage has been introduced into the low k dielectric material from the Ar sputtering process. This becomes a major yield detractor and a reliability concern for advanced chip manufacturing.

The detailed processing steps of the existing prior art approach for via gouging are illustrated in FIGS. 1A-1E and are described herein below. Reference is first made to FIG. 1A which illustrates a prior art structure that is formed after dual damascene patterning of an upper interconnect level 108 which is located atop a lower interconnect level 100. The lower interconnect level 100 includes a first low k dielectric material 102 which includes a metallic, i.e., Cu, feature 104 therein. The lower interconnect level 100 is separated in part from the upper interconnect level 108 by a capping layer 106. The upper interconnect level 108 includes a second low k dielectric material 110 that includes both a line opening 112 and a via opening 114 located therein. A surface of the metallic feature 104 of the lower interconnect level 100 that is beneath the via opening 114 is exposed as is shown in FIG. 1A.

FIG. 1B shows the prior art structure of FIG. 1A after forming a diffusion barrier 116, e.g., TaN, over all of the exposed surfaces. Argon sputtering, such as is shown in FIG. 1C, is then performed to clean the bottom horizontal surface within the via opening 114 and form a gouging feature (i.e., anchoring area) 118 into the metallic feature 104 of the lower interconnect level 100. The gouging feature 118 is employed to enhance the interconnect strength between the various interconnect levels shown. During the Ar sputtering process, the diffusion barrier 116 is removed from the bottom of each of the line openings 112, and dielectric damages 120 (which are indicated by circles in the second low k dielectric material 110) are formed at the bottom of each of the line openings 112. The dielectric damages 120 formed during the sputtering process are due to the inherent aggressive nature of prior art sputtering processes.

FIG. 1D shows the prior art structure of FIG. 1C after forming a metal liner layer 122, e.g., Ta, Ru, Ir, Rh or Pt, on the exposed surfaces thereof. FIG. 1E illustrates the prior art structure after filling the line and via openings (112 and 114, respectively) with a conductive metal, e.g., Cu, 124 and planarization. As shown in FIG. 1E, the prior art structure has poor diffusion barrier 116 coverage (designated by reference numeral 126) at the bottom of the metallic filled lines and a feature-bottom roughness which is a result of the damages 120 formed into the second low k dielectric material 110. Both of these characteristics reduce the quality of the diffusion barrier 116 and degrade the overall wiring reliability. Moreover, both of the aforementioned characteristics result in the structure exhibiting a high-level of metal-to-metal leakage.

In view of the above drawbacks with prior interconnect structures there is a need for developing a new and improved integration scheme that avoids the removal of the diffusion barrier from the horizontal surfaces of the line opening formed into an interconnect dielectric material and thereby introducing no damages into the interconnect dielectric material.

BRIEF SUMMARY

The present invention provides an interconnect structure including a gouging feature at the bottom of a via opening and a method of forming the same. The method of the present invention does not disrupt the coverage of the deposited diffusion barrier in a line opening that is located atop the via opening, and/or does not introduce damages caused by creating a gouging feature at the bottom of the via opening by sputtering into the interconnect dielectric material that includes the via and line openings. In accordance with the present invention, such an interconnect structure is achieved by providing a gouging feature in the bottom of the via opening by first forming the line opening within the interconnect dielectric material, followed by forming the via opening and then the gouging feature.

Although the line opening is formed in the present invention prior to formation of the via opening and the gouging feature, no damages of the interconnect dielectric material occurs since portions of the line opening are protected during the formation of the via opening and the gouging feature by at least a planarization material and, optionally, a trench diffusion barrier. As such, the inventive method provides an interconnect structure including a gouging feature at the bottom of a via opening that has improved wiring and a lower-level of metal-to-metal leakage than the prior art interconnect structures such as those fabricated using the technique illustrated in FIGS. 1A-1E.

In one embodiment of the present invention, a semiconductor interconnect structure is provided that includes a lower interconnect level including a first dielectric material having at least one conductive feature embedded therein; a dielectric capping layer located on the first dielectric material and some, but not all, portions of the at least one conductive feature; and an upper interconnect level including a second dielectric material having at least one conductively filled via and an overlying conductively filled line disposed therein, wherein the at least one conductively filled via is in contact with an exposed surface of the at least one conductive feature of the first interconnect level by an gouging feature, i.e., anchoring area.

In the inventive structure, the at least one conductively filled line includes a trench diffusion barrier and a combined trench and via diffusion barrier separating the at least one conductively filled line from an upper portion of the second dielectric material, while the at least one conductively filled via includes only the combined trench and via diffusion barrier separating a lower portion of the at least one conductively filled via and the second dielectric material, wherein the combined trench and via diffusion barrier is also positioned at the gouging feature between a lower portion of the at least one conductively filled via and the at least one conductive feature embedded in the first dielectric material.

It is observed that the term "combined trench and via diffusion barrier" denotes a continuous diffusion barrier that is present in the conductively filled line, the conductively filled via, and in the gouging feature. It represents a different layer or material stack from that of the trench diffusion barrier which is present only within the conductively filled line of the inventive interconnect structure.

Another aspect of the present invention relates to a method of fabricating the interconnect structure described above. The inventive method includes providing a structure including a first dielectric material having at least one conductive feature embedded therein and a second dielectric located above the first dielectric material, the first dielectric material having at least one line opening located therein that is lined with a trench diffusion barrier; forming at least one extended via opening within the second dielectric material; forming at least one gouging feature within the at least one conductive feature; forming a combined trench and via diffusion barrier within the at least one line opening and the at least one extended via opening, and atop the at least one gouging feature; and filling the at least one line opening and the at least one via opening with an interconnect conductive material.

In some embodiments of the present invention, the trench diffusion barrier can be omitted. When the trench diffusion barrier is not employed the processing steps include: providing a structure including a first dielectric material having at least one conductive feature embedded therein and a second dielectric located above the first dielectric material, the first dielectric material having at least one line opening; forming at least one extended via opening within the second dielectric material; forming at least one gouging feature within the at least one conductive feature; forming a combined trench and via diffusion barrier within the at least one line opening and the at least one extended via opening, and atop the at least one gouging feature; and filling the at least one line opening and the at least one via opening with an interconnect conductive material.

DETAILED DESCRIPTION

The present invention, which provides an interconnect structure including a gouged via feature (i.e., anchored via bottom) and a method of fabricating the same, will now be described in greater detail by referring to the following discussion and drawings that accompany the present application. The drawings of the present application, which are referred to herein below in greater detail, are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1A:
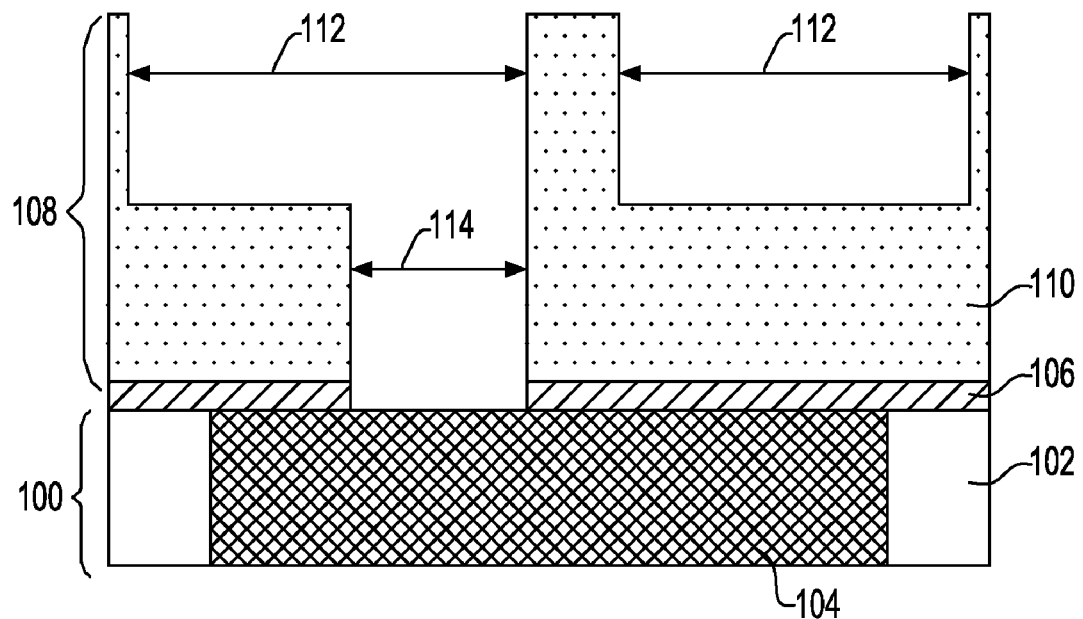
FIGS. 1A-1E are pictorial representations (through cross sectional views) illustrating the basic processing steps used in the prior art in forming an interconnect structure.
Figure 1B:
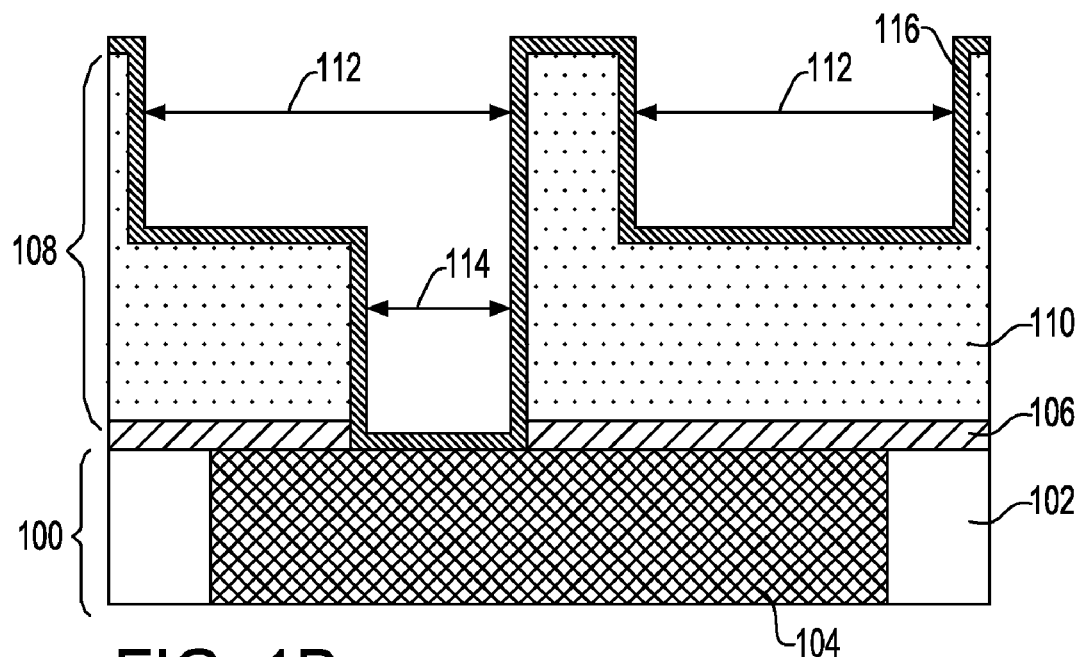
Figure 1C:
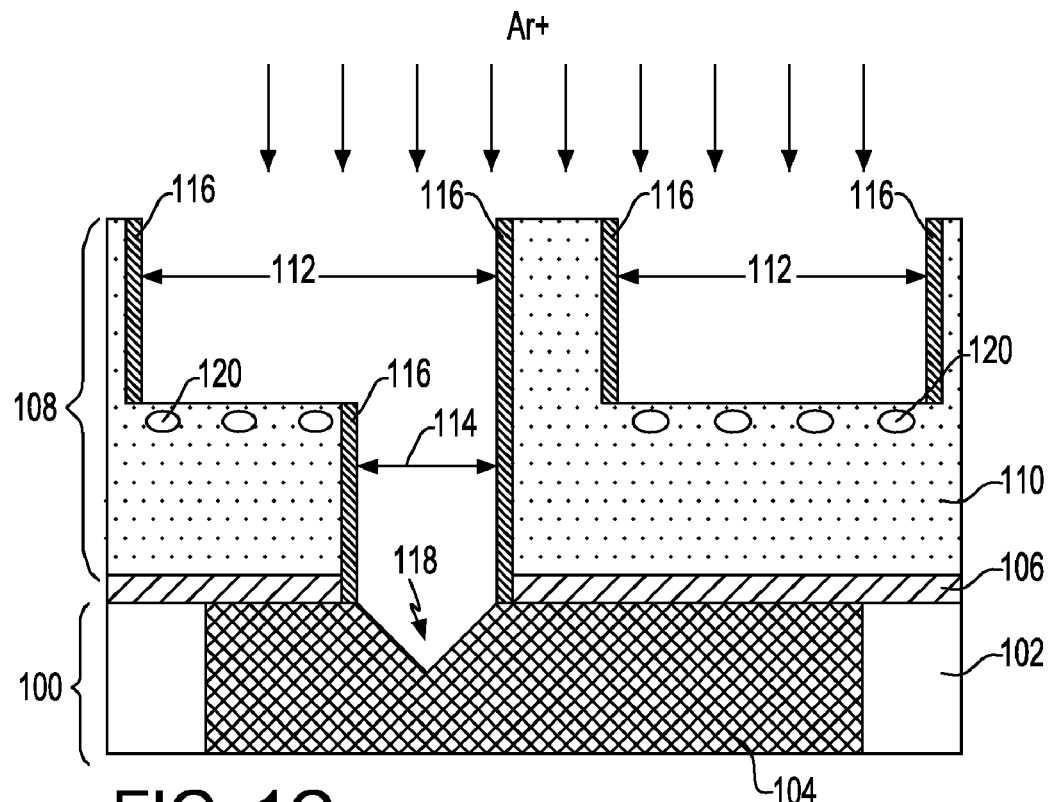
Figure 1D:
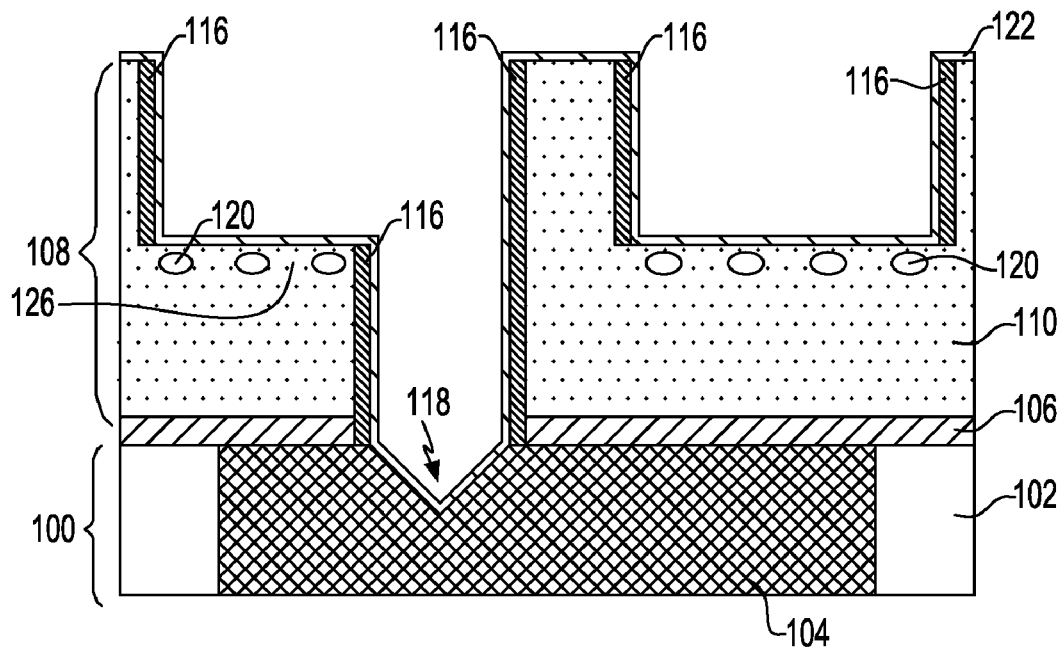
Figure 1E:
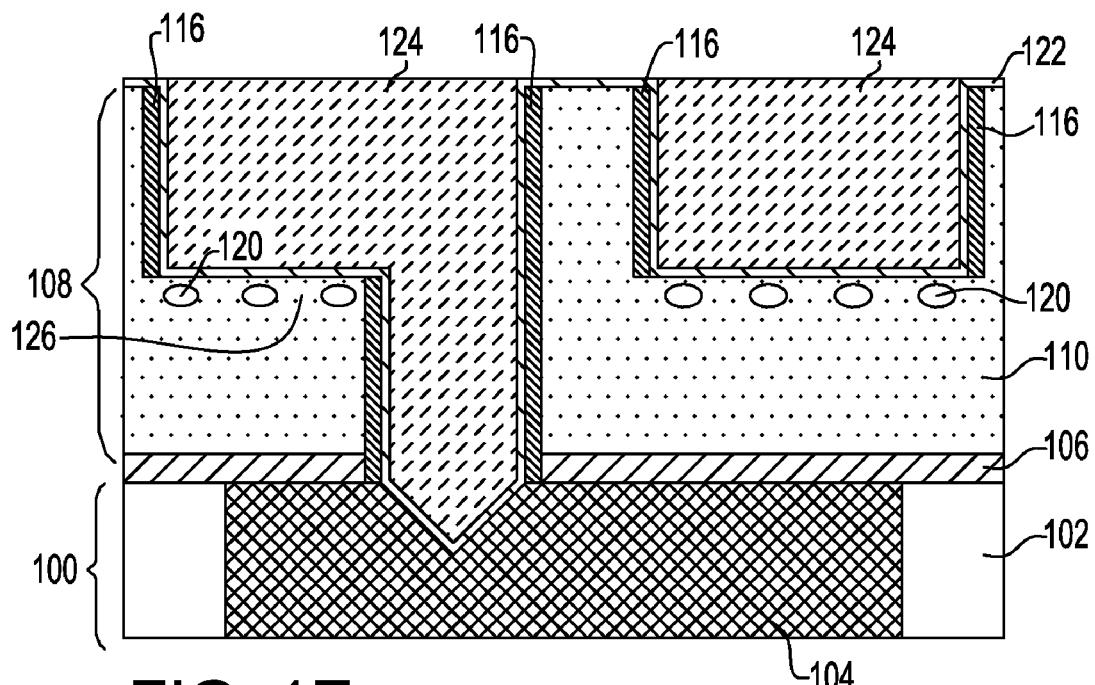
Figure 2:
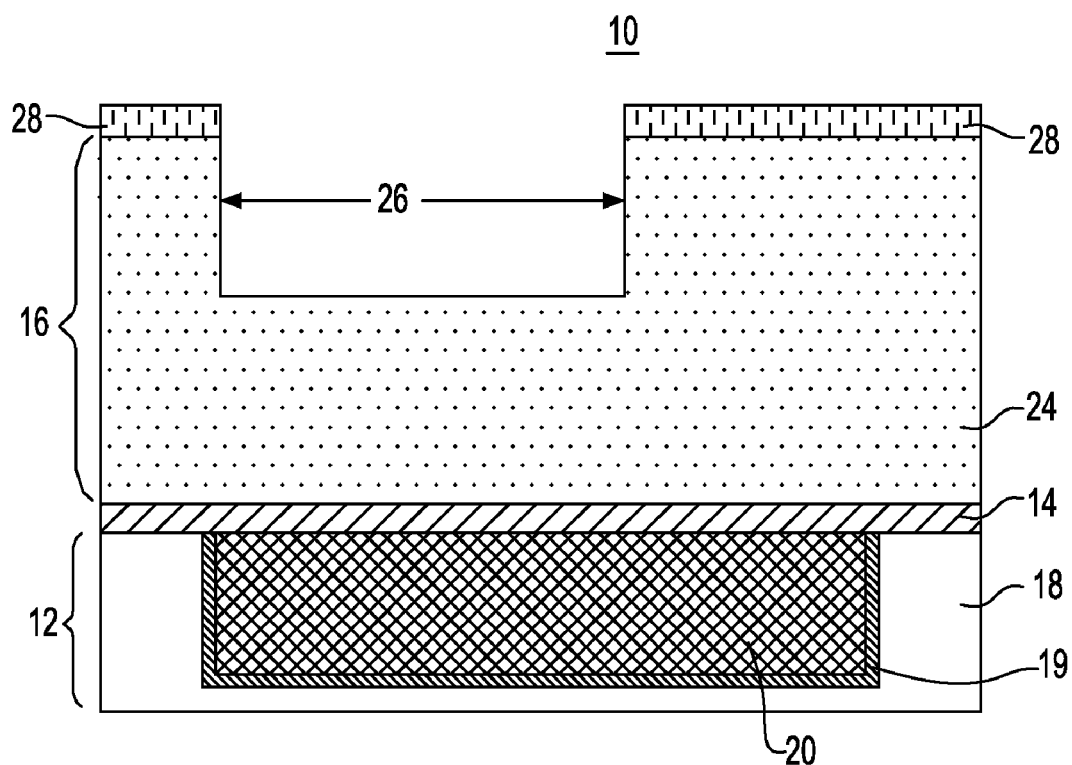
FIG. 2 is a pictorial representation (through a cross sectional view) illustrating an initial structure of the present invention after forming a line opening within an upper interconnect level of the initial structure.

The process flow of the present invention begins with providing the initial interconnect structure 10 shown in FIG. 2. Specifically, the initial interconnect structure 10 shown in FIG. 2 comprises a multilevel interconnect including a lower interconnect level 12 and an upper interconnect level 16 that are separated by a dielectric capping layer 14. The lower interconnect level 12, which may be located above a semiconductor substrate (not shown) including one or more semiconductor devices, comprises a first dielectric material 18 having at least one conductive feature (i.e., a conductive region) 20 that is separated from the first dielectric layer 18 by a barrier layer 19. The upper interconnect level 16 comprises a second dielectric material 24 that has at least one via line 26 located therein. As is shown, the at least one line opening 26 stops within the second dielectric material 24 and is located above a portion of the underlying conductive feature 20. Atop the upper interconnect level 16 is a patterned hard mask 28. Although the structure shown in FIG. 2 illustrates a single line opening 26, the present invention contemplates forming any number of such line openings in the second dielectric material 24 which stop within the second dielectric material 24 and are located over other conductive features that are included within the lower interconnect level 12.

The initial structure 10 shown in FIG. 2 is made utilizing conventional techniques well known to those skilled in the art. For example, the initial interconnect structure can be formed by first applying the first dielectric material 18 to a surface of a substrate (not shown). The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

The first dielectric material 18 of the lower interconnect level 12 may comprise any interlevel or intralevel dielectric including inorganic dielectrics or organic dielectrics. The first dielectric material 18 may be porous or non-porous, with porous dielectrics having a dielectric constant of about 2.8 or less being highly preferred in some embodiments of the present invention. Some examples of suitable dielectrics that can be used as the first dielectric material 18 include, but are not limited to $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first dielectric material 18 typically has a dielectric constant that is about 4.0 or less, with a dielectric constant of about 2.8 or less being even more typical. These dielectrics generally have a lower parasitic crosstalk as compared with dielectric materials that have a higher dielectric constant than 4.0. The thickness of the first dielectric material 18 may vary depending upon the dielectric material used as well as the exact number of dielectrics within the lower interconnect level 12. Typically, and for normal interconnect structures, the first dielectric material 18 has a thickness from 200 nm to 450 nm.

The lower interconnect level 12 also has at least one conductive feature 20 that is embedded in (i.e., located within) the first dielectric material 18. The conductive feature 20 comprises a conductive material that is separated from the first dielectric material 18 by a barrier layer 19. The conductive feature 20 is formed by lithography (i.e., applying a photoresist to the surface of the first dielectric material 18, exposing the photoresist to a desired pattern of radiation, and developing the exposed resist utilizing a conventional resist developer), etching (dry etching or wet etching) an opening in the first dielectric material 18 and filling the etched region with the barrier layer 19 and then with a conductive material forming the conductive region. The barrier layer 19, which may comprise Ta, TaN, Ti, TiN, Ru, RuN, W, WN or any other material that can serve as a barrier to prevent conductive material from diffusing there through, is formed by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the barrier layer 19 may vary depending on the exact means of the deposition process as well as the material employed. Typically, the barrier layer 19 has a thickness from 4 nm to 40 nm, with a thickness from 7 nm to 20 nm being more typical.

Following the barrier layer 19 formation, the remaining region of the opening within the first dielectric material 18 is filled with a conductive material forming the conductive feature 20. The conductive material used in forming the conductive feature 20 includes, for example, polySi, a conductive metal, an alloy comprising at least one conductive metal, a conductive metal silicide or combinations thereof. Preferably, the conductive material that is used in forming the conductive feature 20 is a conductive metal such as Cu, W or Al, with Cu or a Cu alloy (such as AlCu) being highly preferred in the present invention. The conductive material is filled into the remaining opening in the first dielectric material 18 utilizing a conventional deposition process including, but not limited to CVD, PECVD, sputtering, chemical solution deposition or plating. After deposition, a conventional planarization process such as, for example, chemical mechanical polishing (CMP) can be used to provide a structure in which the barrier layer 19 and the conductive feature 20 each have an upper surface that is substantially coplanar with the upper surface of the first dielectric material 18.

After forming the at least one conductive feature 20, a blanket dielectric capping layer 14 is formed on the surface of the lower interconnect level 12 utilizing a conventional deposition process such as, for example, CVD, PECVD, chemical solution deposition, or evaporation. The dielectric capping layer 14 comprises any suitable dielectric capping material such as, for example, SiC, $Si_4NH_3$, $SiO_2$, a carbon doped oxide, a nitrogen and hydrogen doped silicon carbide SiC(N, H) or multilayers thereof. The thickness of the dielectric capping layer 14 may vary depending on the technique used to form the same as well as the material make-up of the layer. Typically, the dielectric capping layer 14 has a thickness from 15 nm to 55 nm, with a thickness from 25 nm to 45 nm being more typical.

Next, the upper interconnect level 16 is formed by applying the second dielectric material 24 to the upper exposed surface of the dielectric capping layer 14. The second dielectric material 24 may comprise the same or different, preferably the same, dielectric material as that of the first dielectric material 18 of the lower interconnect level 12. The processing techniques and thickness ranges for the first dielectric material 18 are also applicable here for the second dielectric material 24. The second dielectric material 24 can also comprise two different materials, i.e., deposition of one dielectric material first, followed by deposition of a different dielectric material. In one embodiment of the present invention, the second dielectric material 24 comprises two different low k dielectric materials and thus the upper interconnect level 16 has a hybrid structure with the subsequently filled conductively filled line embedded in a porous dielectric material, and the subsequently filled via embedded in a dense (i.e., non porous) dielectric material. In such an embodiment, the porous low k dielectric has a dielectric constant of about 2.8 or less, and the dense porous low k dielectric has a dielectric constant of about 4.0 or less.

Next, at least one line opening 26 is formed into the second dielectric material 24 by first forming a blanket hard mask material atop the upper surface of the second dielectric material 24. The blanket hard mask material includes an oxide, nitride, oxynitride or any combination including multilayers thereof. Typically, the hard mask material is an oxide such as $SiO_2$ or a nitride such as $Si_3N_4$. The blanket hard mask material is formed utilizing a conventional deposition process such as, for example, CVD, PECVD, chemical solution deposition or evaporation. The thickness of the as-deposited hard mask material may vary depending upon the type of hard mask material formed, the number of layers that make up the hard mask material and the deposition technique used in forming the same. Typically, the as-deposited hard mask material has a thickness from about 10 nm to about 80 nm, with a thickness from about 20 nm to about 60 nm being even more typical.

After forming the blanket layer of hard mask material, a photoresist (not shown) is formed atop the hard mask material utilizing a conventional deposition process such as, for example, CVD, PECVD, spin-on coating, chemical solution deposition or evaporation. The photoresist may be a positive-tone material, a negative-tone material or a hybrid material, each of which is well known to those skilled in the art. The photoresist is then subjected to a lithographic process which includes exposing the photoresist to a pattern of radiation and developing the exposed resist utilizing a conventional resist developer. The lithographic step provides a patterned photoresist atop the hard mask material that defines the width of the line opening 26.

After providing the patterned photoresist, the line pattern is transferred into the hard mask material and then subsequently into the second dielectric material 24 utilizing one or more etching process. The patterned photoresist can be stripped immediately after the line pattern is transferred into the hard mask forming patterned hard mask 28 utilizing a conventional stripping process. Alternatively, the patterned photoresist can be stripped after the line pattern is first formed in the hard mask forming patterned hard mask 28 and then transferred into the second dielectric material 24. The etching used in transferring the line pattern may comprise a dry etching process, a wet chemical etching process or a combination thereof. The term "dry etching" is used herein to denote an etching technique such as reactive-ion etching, ion beam etching, plasma etching or laser ablation.

Figure 3:
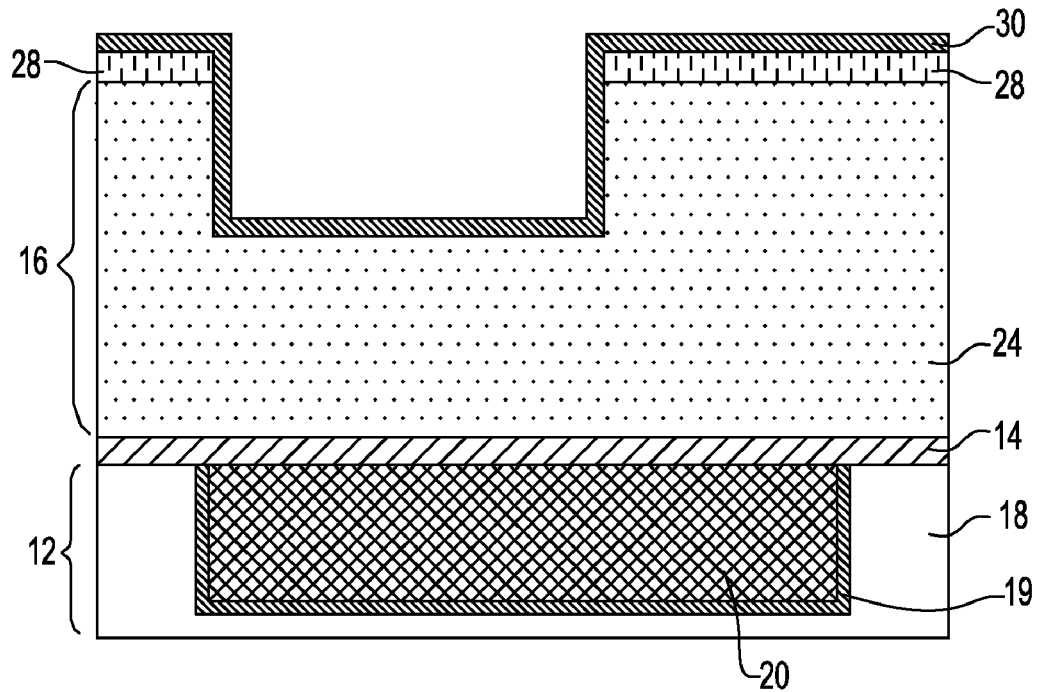
FIG. 3 is a pictorial representation (through a cross sectional view) illustrating the structure of FIG. 2 after forming a trench diffusion barrier at least within the line opening.

After forming the initial interconnect structure 10 shown in FIG. 2, a trench diffusion barrier 30 is then formed over all of the exposed surfaces of the initial interconnect structure providing the structure shown, for example, in FIG. 3. In some embodiments of the present invention, the formation of the trench diffusion barrier 30 within the line opening 26 is omitted and the process continues with the next step illustrated in FIG. 4. Although such an embodiment is possible, it is preferred to form trench diffusion barrier 30 within the line opening 26.

As is shown, trench diffusion barrier 30 covers the exposed surfaces of the patterned hard mask 28, and the exposed surfaces (e.g., sidewalls that extend to a common bottom wall) of the second dielectric material 24 within the line opening 26. In accordance with the present invention, the trench diffusion barrier 30 is a thin layer whose thickness is typically within the range from 0.5 nm to 20 nm, with a thickness from 1 nm to 10 nm being even more typical. The trench diffusion barrier 30 is formed utilizing a conventional deposition process including, but not limited to CVD, PVD, ALD or spin-on coating. The trench diffusion barrier 30 comprises a layer or material stack including any material that is resistant to metal diffusion including, for example, TaN, Ta, Ti, TiN, RuTa, RuTaN, W, Ru, Co, Rh or Ir or any combination thereof.

Figure 4:
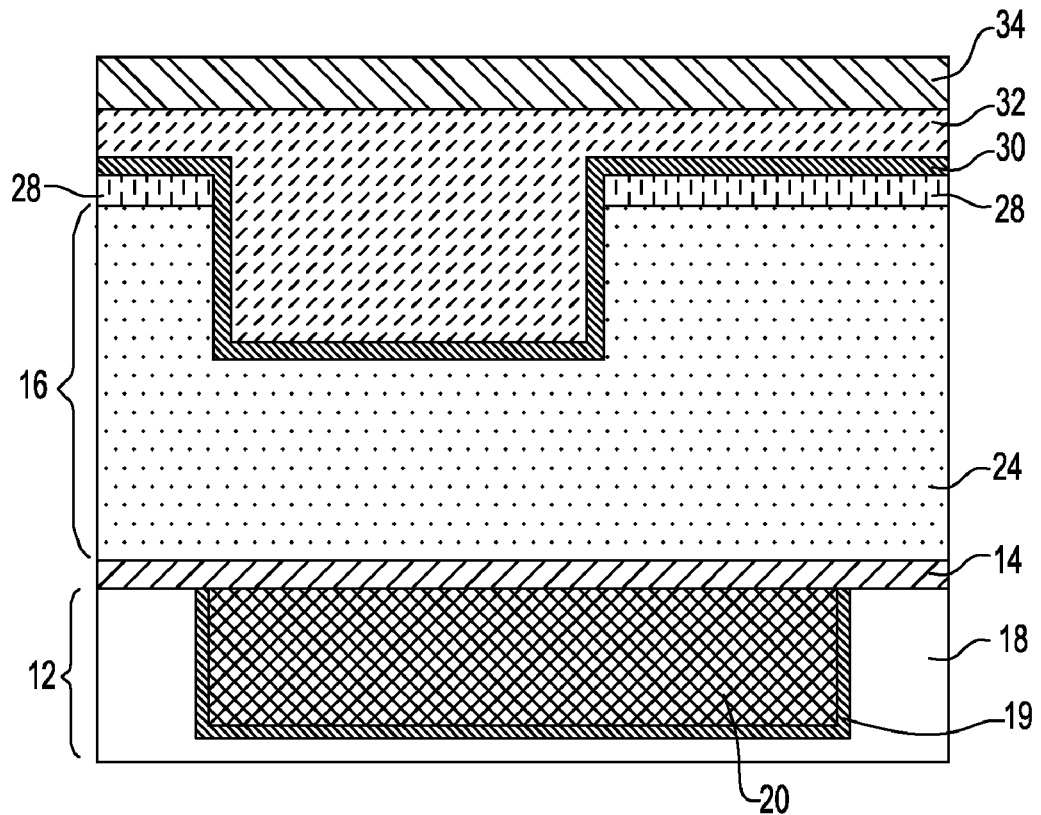
FIG. 4 is a pictorial representation (through a cross sectional view) illustrating the structure of FIG. 3 after formation of a planarization layer and an oxide-containing layer.

Next, and as shown in FIG. 4, a planarization layer 32 is deposited filling the line opening 26 and extending onto the trench diffusion barrier 30 that is located on the surface of patterned mask 28. In embodiments in which the trench dielectric 30 is not utilized, the planarization layer 32 directly contacts the exposed wall portions of the second dielectric material 24 as well as the upper surface of the patterned hard mask 28.

The planarization layer 32 is deposited utilizing a conventional deposition process including, for example, CVD, PECVD, spin-on coating, evaporation or chemical solution deposition. The planarization material includes a conventional antireflective coating material or a spun-glass material.

Still referring to FIG. 4, and after formation of the planarization layer 32, an oxide-containing layer 34 such as a low-temperature oxide is then formed atop the surface of the planarization layer 32. The oxide-containing layer 34 is formed utilizing any conventional deposition process including, but not limited to CVD, and PECVD in which the deposition temperature is less than 500° C. The oxide-containing layer 34 has a thickness that is typically from 5 nm to 100 nm, with a thickness from 20 nm to 50 nm being more typical.

Figure 5:
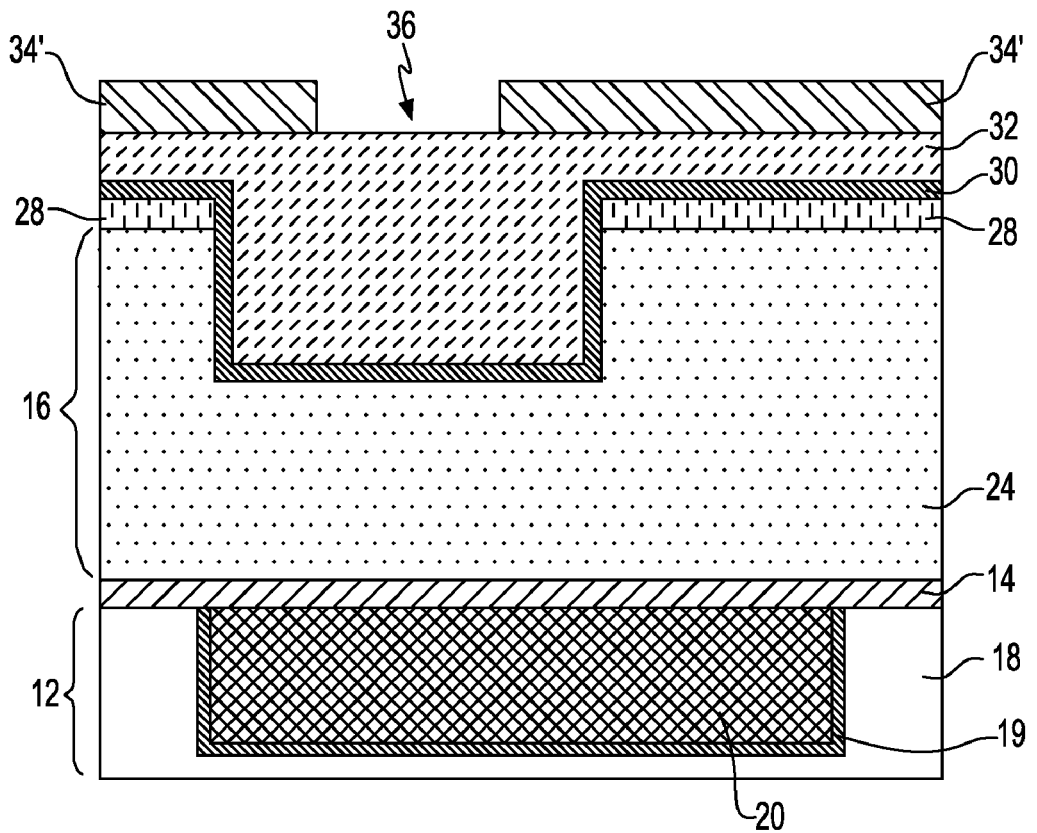
FIG. 5 is a pictorial representation (through a cross sectional view) illustrating the structure of FIG. 4 after forming a via opening into the oxide-containing layer.

A patterned photoresist (not specifically shown) containing a via opening pattern is then formed on the upper surface of the oxide-containing layer 34 by deposition and lithography. An etching step is then performed that transfers the via opening pattern from the patterned photoresist into at least the oxide-containing layer 34. The via opening pattern transfer is performed utilizing one of the etching steps mentioned above in forming the line opening 26 into the second dielectric material 24. After transferring the via pattern into the oxide-containing layer 34, the patterned photoresist is stripped utilizing a conventional resist stripping process such as, for example, ashing. The resultant structure that is formed after performing these steps is shown, for example, in FIG. 5. In FIG. 5, the patterned oxide-containing layer is designated by reference numeral 34', while the initial via opening is designated by reference numeral 36.

Figure 6:
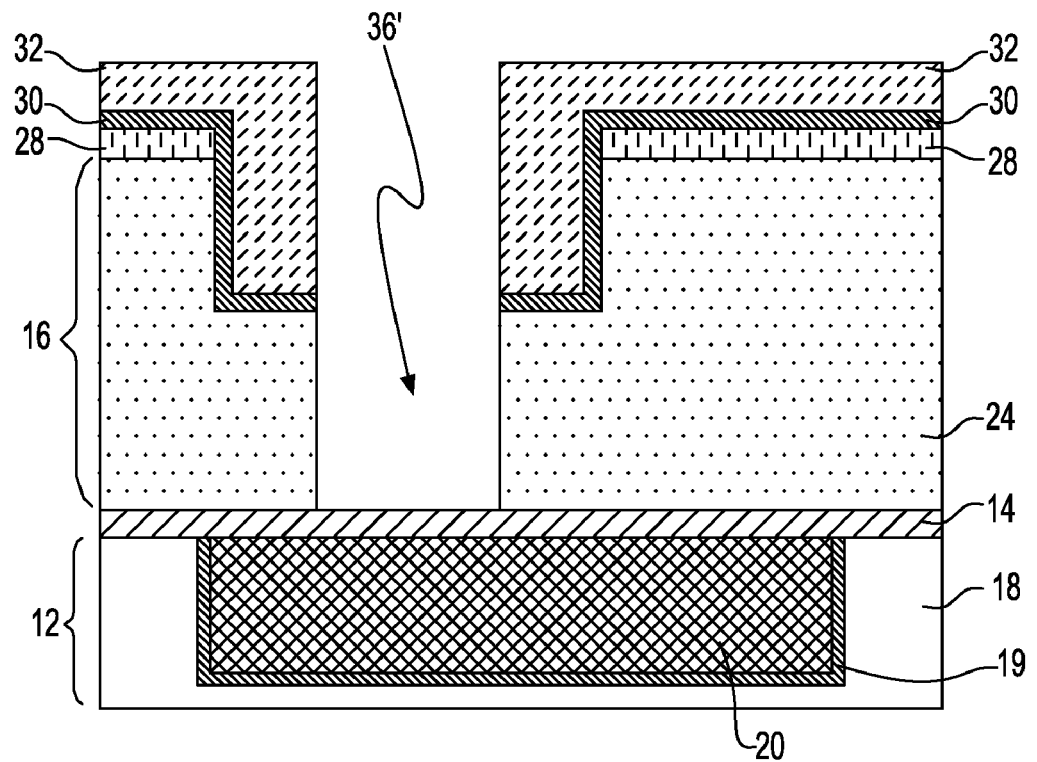
FIG. 6 is a pictorial representation (through a cross sectional view) illustrating the structure of FIG. 5 after extending the via opening to a conductive feature within an underlying lower interconnect level.

Next, and as illustrated in FIG. 6, the initial via opening 36 is extended down through portions of the planarization layer 32, portions of the trench diffusion barrier 30, if present, and underlying portions of the second dielectric material 26, stopping atop a surface the dielectric capping layer 14 forming extended via opening 36'. In some embodiments, the etching step can also punch through, i.e., remove a portion of the dielectric capping layer 14, stopping atop a surface of the conductive feature 20. The extending of the initial via opening 36 includes one or more etching processes which are capable of forming the structure shown in FIG. 6. As shown, the line opening 26 which is protected by at least the remaining planarization layer 32, is located above and connected to the extended via opening 36'. It is observed that during the one or more etching steps, the patterned oxide-containing layer 34' is also removed as shown in FIG. 6.

Next, the structure shown in FIG. 6, with or without first opening the dielectric capping layer 14, is subjected to an Ar sputtering process which removes the portions of the dielectric capping layer, if not previously removed, from the bottom of the extended via opening 36' and punches through the underlying conductive feature 20 so as to create a gouging feature (or anchoring area) 38 within the conductive feature 20. The resultant structure after Ar sputtering is shown, for example, in FIG. 7. The second dielectric material 24 is not damaged during this process since it is protected by at least the remaining planarization layer 32 and, if present, the trench diffusion barrier 30, and patterned hard mask layer 28.

The Ar sputtering process utilized in forming the gouging feature 38 comprises any conventional Ar sputtering process that is typically used in interconnect technology to form such a feature. By way of illustration, Ar sputtering can be performed utilizing the following non-limiting conditions: gas flow of 20 sccm Ar, temperature of 25° C., bias of top electrode of 400 KHz and 750 W, table bias of 13.6 MHz and 400 W, and a process pressure of 0.6 mtorr. While Ar is shown for purpose of illustration, any other gas such as He, Ne, Xe, $N_2$, $H_2$, $NH_3$, $N_2H_2$, or mixtures thereof, can also be used for the sputtering process.

In some embodiments (not specifically shown) of the present invention a metallic interfacial layer can be formed on at least the gouged surface of the conductive feature 20. When present, the metallic interfacial layer is formed utilizing any conventional deposition process including, for example, CVD, PECVD, chemical solution deposition, evaporation, metalorgano deposition, ALD, sputtering, PVP or plating (electroless or electro). The thickness of the metallic interfacial layer may vary depending on the exact metallic interfacial material used as well as the deposition technique that was used in forming the same. Typically, the metallic interfacial layer has a thickness from 0.5 nm to 40 nm, with a thickness from 1 nm to 10 nm being even more typical. The metallic interfacial layer comprises a metallic barrier material such as, for example, Co, TaN, Ta, Ti, TiN, Ru, Ir, Au, Rh, Pt, Pd or Ag. Alloys of such materials are also contemplated.

Figure 7:
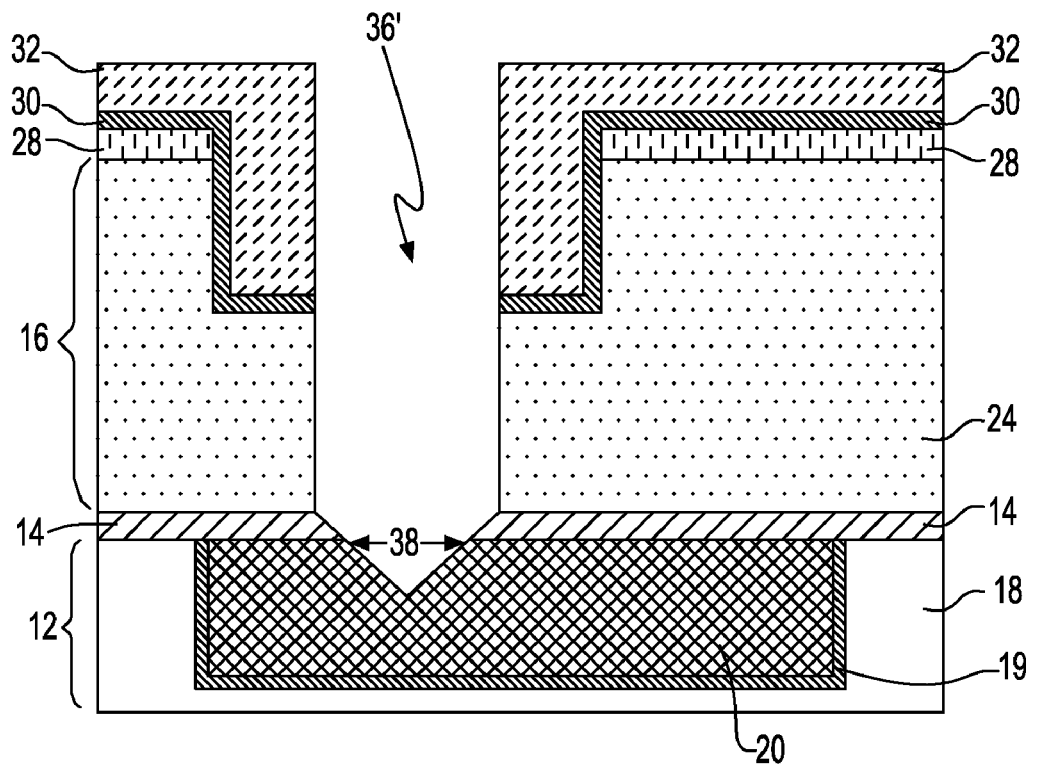
FIG. 7 is a pictorial representation (through a cross sectional view) illustrating the structure of FIG. 6 after forming a gouging feature into the conductive feature within the underlying lower interconnect level.
Figure 8:
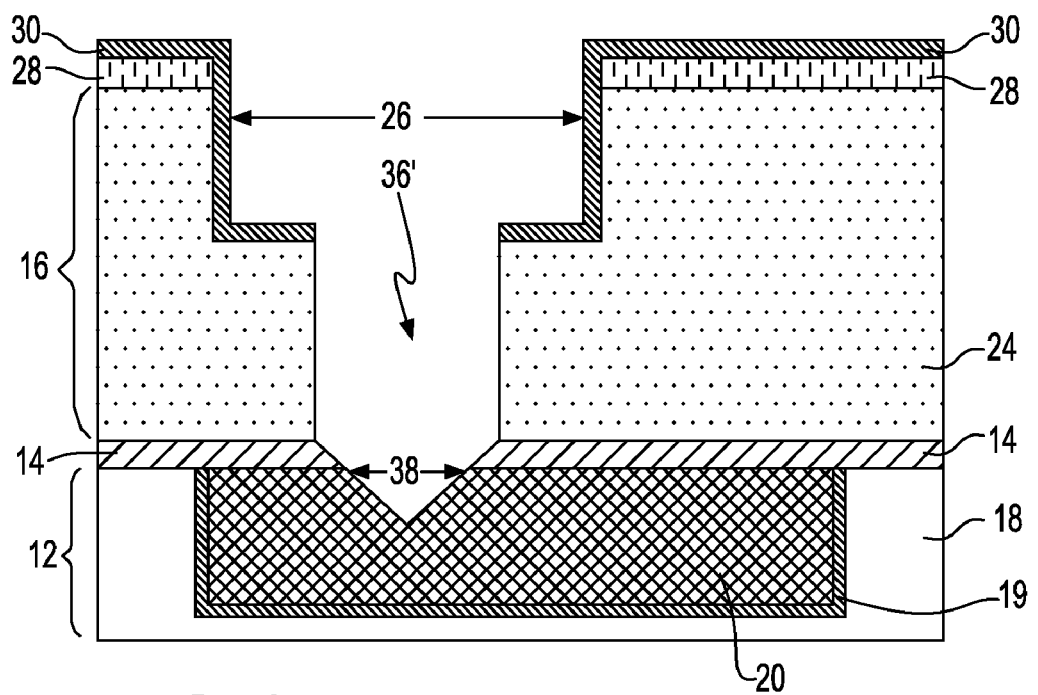
FIG. 8 is a pictorial representation (through a cross sectional view) illustrating the structure of FIG. 7 after removing the remaining planarizing material from the line opening.

FIG. 8 shows the structure of FIG. 7 after the remaining planarization layer 32 has been stripped from within the line opening 26. The stripping of the remaining planarization layer 32 is performed utilizing either a chemical wet etching process or a chemical ashing process that is selective in removing the planarizing material from the structure.

In some embodiments of the present invention, oxide or etch residue (not shown) may remain in the gouging feature 38. In such instances, the oxide or etch residue can be removed from the gouging feature 38 utilizing a surface cleaning process that may include a wet chemical etching process and/or a slight Ar bombardment. No damage occurs in this instance since the Ar bombardment conditions are not as harsh as that used in forming the gouging feature 38. Typically, the process time used in the present case for only surface cleaning is less than 5 seconds compared to longer than 10 seconds for creating the gouging feature. By way of illustration, Ar sputtering can be performed utilizing the following non-limiting conditions: gas flow of 20 sccm Ar, temperature of 25° C., bias of top electrode of 400 KHz and 400 W, table bias of 13.6 MHz and 200 W, and a process pressure of 0.6 mtorr. While Ar is shown for purpose of illustration, any other gas such as He, Ne, Xe, $N_2$, $H_2$, $NH_3$, $N_2H_2$ or mixtures thereof, can also be used for the sputtering process.

In some embodiments of the present invention, etching residues are removed from the line opening 26 and from the at least extended via opening 36'. In one embodiment, plasma etching, which contains at least one or combination of $O_2$, $H_2$, $N_2$, CO, $CO_2$, or $NH_3$ is employed. In another embodiment, the etching residues are removed by a wet clean, which contains at least one or combination of HF, HCl, $H_2SO_4$, or $HNO_3$.

Figure 9:
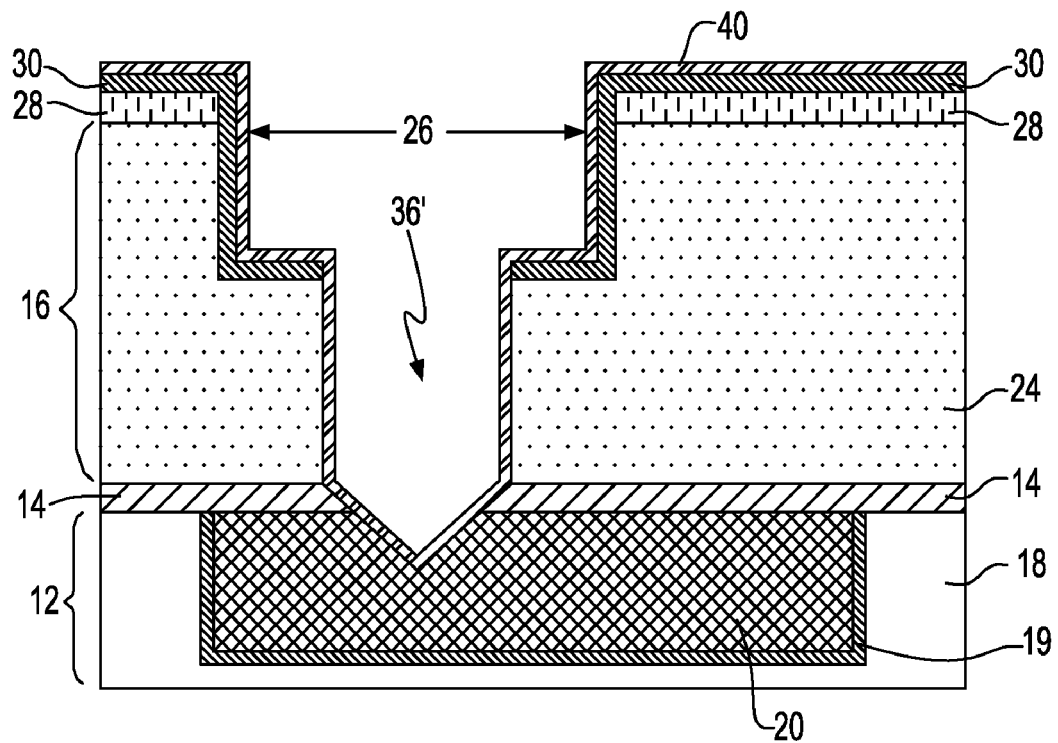
FIG. 9 is a pictorial representation (through a cross sectional view) illustrating the structure of FIG. 8 after forming a combined trench and via diffusion barrier within both the via and line openings.

At this point of the inventive method, a combined trench and via diffusion barrier 40 is formed into the structure shown in FIG. 8 providing the structure shown in FIG. 9. As shown, the combined trench and via diffusion barrier 40 is present in both the line opening 26 and the extended via opening 36', whereas, if present, the trench diffusion barrier 30 is present only within the line opening 26. When the trench diffusion barrier 30 is present, the combined trench and via diffusion barrier 40 is located atop the trench diffusion barrier 30 in the line opening, atop exposed wall surfaces of the second dielectric material 24 within the extended via opening 36' and atop the gouged surface of the conductive feature 20.

The combined trench and via diffusion barrier 40 comprises any material that can serve as a barrier to prevent a conductive material from diffusing there through. Illustratively, the combined trench and via diffusion barrier 40 includes a layer or material stack of TaN, Ta, Ti, TiN, RuTa, RuTaN, W, Ru, Co, Rh or Ir or any combination thereof. It is observed that the combined trench and via diffusion barrier layer 40 represents a different layer or material stack than trench diffusion barrier 30.

The combined trench and via diffusion barrier 40, which is a continuous layer present in both the line opening and the extended via opening, is formed utilizing a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the combined trench and via diffusion barrier 40 may vary depending on the number of material layers within the barrier, the technique used in forming the same as well as the material of the diffusion barrier itself. Typically, the combined trench and via diffusion barrier 40 has a thickness from 4 nm to 40 nm, with a thickness from 7 nm to 20 nm being even more typical.

In some embodiments of the present invention, a plating seed layer (not shown) is now formed into the structure shown in FIG. 9. When employed, the plating seed layer is comprised of Cu or a metal or metal alloy from Group VIIIA of the Periodic Table of Elements. Examples of suitable Group VIIIA elements for the plating seed layer include, but are not limited to Ru, TaRu, Ir, Rh, Pt, Pd and alloys thereof. In some embodiments, it is preferred to use Cu, Ru, Ir or Rh as the plating seed layer.

The plating seed layer is formed by a conventional deposition process including, for example, chemical vapor deposition (CVD), plasma enhanced chemical vapor deposition (PECVD), atomic layer deposition (ALD), plating, sputtering and physical vapor deposition (PVP). The thickness of the plating seed layer may vary depending on number of factors including, for example, the compositional material of the plating seed layer and the technique that was used in forming the same. Typically, the plating seed layer has a thickness from about 0.5 nm to about 10 nm, with a thickness of less than 6 nm being even more typical.

Figure 10:
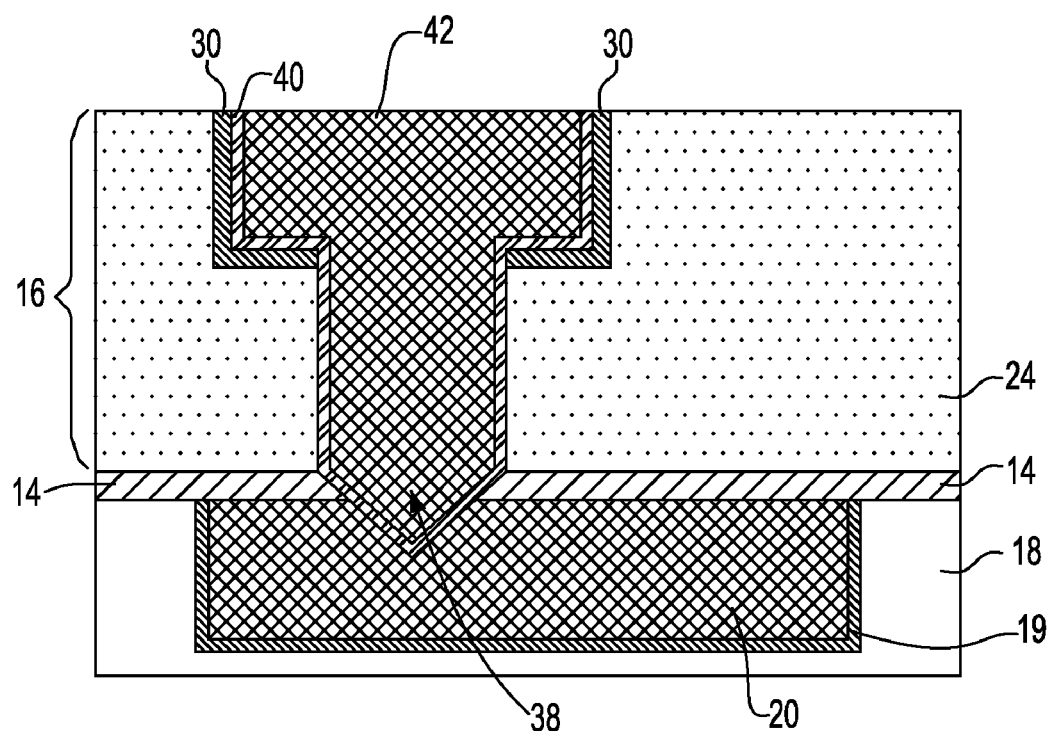
FIG. 10 is a pictorial representation (through a cross sectional view) illustrating the structure of FIG. 9 after filling both the via and line openings with an interconnect conductive material and planarization.

Next, the structure shown in FIG. 9, with or without the plating seed layer, is filled with an interconnect conductive material 42 and planarized to provided the planarized structure shown in FIG. 10. As illustrated, the interconnect conductive material fills the extended via opening 36', and the line opening 26 as well as the gouging feature 38. The interconnect conductive material 42 may comprise the same or different, preferably the same, conductive material as that of the conductive feature 20. Preferably, Cu, Al, W or alloys thereof are used, with Cu or AlCu being most preferred. The interconnect conductive material 42 is formed utilizing the same deposition processing as described above in forming the conductive feature 20 and following deposition of the conductive material, the structure is subjected to planarization. The planarization process, which includes chemical mechanical polishing and/or grinding, removes various materials, e.g., the combined trench and via diffusion barrier 40, the trench diffusion barrier 30, and the patterned hard mask 28, that are located atop the second dielectric material 24 of the upper interconnect level 16.

The method of the present application is applicable in forming additional interconnect levels atop the levels depicted in FIG. 10. Each of the various interconnect levels would include the gouging feature described hereinabove.

Because of the integration processing scheme described above, no damaged regions are formed into the second dielectric material 24 during the formation of the gouging feature 38.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor interconnect structure comprising:
a lower interconnect level including a first dielectric material having at least one conductive feature embedded therein;
a dielectric capping layer located on the first dielectric material and some, but not all, portions of the at least one conductive feature; and
an upper interconnect level including a second dielectric material having at least one conductively filled via and an overlying conductively filled line disposed therein, wherein the at least one conductively filled via is in contact with an exposed surface of the at least one conductive feature of the lower interconnect level by a gouging feature, and wherein the at least one conductively filled line includes a trench diffusion barrier and a combined trench and via diffusion barrier separating the at least one conductively filled line from an upper portion of the second dielectric material, while the at least one conductively filled via includes only the combined trench and via diffusion barrier separating a lower portion of the at least one conductively filled via from the second dielectric material, and wherein the combined trench and via diffusion barrier is also positioned at the gouging feature between a lower portion of the at least one conductively filled via and the at least one conductive feature embedded in the first dielectric material, wherein the combined trench and via diffusion barrier comprises TaN, Ta, Ti, TiN, RuTa, RuTaN, W, Ru, Co, Rh, Ir or any combination thereof.

2. The semiconductor interconnect structure of claim 1 wherein the first and second dielectric materials comprise the same or different low k dielectric having a dielectric constant of about 4.0 or less.

3. The semiconductor interconnect structure of claim 1 wherein the dielectric capping layer comprises one of SiC, $Si_4NH_3$, $SiO_2$, a carbon doped oxide, a nitrogen and hydrogen doped silicon carbide SiC(N,H) or multilayers thereof.

4. The semiconductor interconnect structure of claim 1 wherein the at least one conductively filled via and the at least one overlying conductively filled line comprise Cu or a Cu-containing alloy.

5. The semiconductor interconnect structure of claim 1 wherein the trench diffusion barrier comprises TaN, Ta, Ti, TiN, RuTa, RuTaN, W, Ru, Co, Rh, Ir or any combination thereof.

6. The semiconductor interconnect structure of claim 1 further comprising a plating seed layer located on the combined trench and via diffusion barrier.

7. The semiconductor interconnect structure of claim 6 wherein the plating seed layer comprises one or combination of Ru, TaRu, Ir, Rh, Pt, Pd, Ta, Cu or alloys thereof.

8. The semiconductor interconnect structure of claim 1 further comprising a metallic interfacial layer located at the gouging feature and positioned between the combined trench and via diffusion barrier and the underlying at least one conductive feature within the first dielectric material.

9. The semiconductor interconnect structure of claim 8 wherein the metallic interfacial layer comprises Co, TaN, Ta, Ti, TiN, Ru, Ir, Au, Rh, Pt, Pd, Ag or alloys thereof.

10. A method of forming a semiconductor interconnect structure comprising:
providing a structure including a first dielectric material having at least one conductive feature embedded therein and a second dielectric material located above the first dielectric material, the second dielectric material having at least one line opening located therein that is lined with a trench diffusion barrier;
forming at least one extended via opening within the second dielectric material, wherein the forming the at least one extended via opening includes forming a planarization material within the at least one line opening and atop the second dielectric material, forming a patterned oxide-containing material on an upper surface of the planarization material, wherein the patterned oxide-containing material has at least via pattern therein, and extending the at least one initial via pattern through at least the planarization layer, the trench diffusion barrier and second dielectric material to provide the at least one extended via opening in the second dielectric material;
forming at least one gouging feature within the at least one conductive feature;
forming a combined trench and via diffusion barrier within the at least one line opening and the at least one extended via opening, and atop the at least one gouging feature; and filling the at least one line opening and the at least one via opening with an interconnect conductive material.

11. The method of claim 10 wherein the forming of the at least one gouging feature comprises gaseous sputtering comprising one of Ar, He, Ne, Xe, $N_2$, $H_2$, $NH_3$, $N_2H_2$ or a mixture thereof.

12. The method of claim 11 wherein the gaseous sputtering also opens a dielectric capping layer position between the first dielectric material and the second dielectric material.

13. The method of claim 10 wherein a dielectric capping layer is positioned between the first and second dielectric material and wherein an etching step is performed between the forming of the at least one extended via opening and the forming of the gouging feature to pattern the dielectric capping layer.

14. A method of forming a semiconductor interconnect structure comprising:
providing a structure including a first dielectric material having at least one conductive feature embedded therein and a second dielectric material located above the first dielectric material, the second dielectric material having at least one line opening;
forming at least one extended via opening within the second dielectric material, wherein the forming the at least one extended via opening includes forming a planarization material within the at least one line opening and atop the second dielectric material, forming a patterned oxide-containing material on an upper surface of the planarization material, wherein the patterned oxide-containing material has at least one initial via pattern therein, and extending the at least one initial via pattern through at least the planarization layer, the trench diffusion barrier and second dielectric material to provide the at least one extended via opening in the second dielectric material;
forming at least one gouging feature within the at least one conductive feature;
forming a metallic interfacial layer on at least the at least one gouging feature;
forming a combined trench and via diffusion barrier within the at least one line opening and the at least one extended via opening, and atop the at least one gouging feature; and
filling the at least one line opening and the at least one via opening with an interconnect conductive material.

15. The method of claim 14 wherein the forming of the at least one gouging feature comprises gaseous sputtering comprising one of Ar, He, Ne, Xe, $N_2$, $H_2$, $NH_3$, $N_2H_2$ or a mixture thereof.

16. The method of claim 15 wherein the gaseous sputtering also opens a dielectric capping layer position between the first dielectric material and the second dielectric material.

17. The method of claim 14 wherein a dielectric capping layer is positioned between the first and second dielectric material and wherein an etching step is performed between the forming of the at least one extended via opening and the forming of the gouging feature to pattern the dielectric capping layer.

18. A semiconductor interconnect structure comprising:
a lower interconnect level including a first dielectric material having at least one conductive feature embedded therein;
a dielectric capping layer located on the first dielectric material and some, but not all, portions of the at least one conductive feature; and
an upper interconnect level including a second dielectric material having at least one conductively filled via and an overlying conductively filled line disposed therein, wherein the at least one conductively filled via is in contact with an exposed surface of the at least one conductive feature of the lower interconnect level by a gouging feature, and wherein the overlying conductively filled line includes both a trench diffusion barrier and a combined trench and via diffusion barrier separating the overlying conductively filled line from an upper portion of the second dielectric material, while the at least one conductively filled via includes only the combined trench and via diffusion barrier separating the at least one conductively filled via from a lower portion of the second dielectric material, and wherein the combined trench and via diffusion barrier is also positioned at the gouging feature between a lower portion of the at least one conductively filled via and the at least one conductive feature embedded in the first dielectric material, and wherein a metallic interfacial layer is located at the gouging feature and positioned between the combined trench and via diffusion barrier and the underlying at least one conductive feature within the first dielectric material.

* * * * *